June 28, 1966 R. C. MIERENDORF ETAL 3,258,661

SEALED SEMICONDUCTOR DEVICE

Filed Dec. 17, 1962

INVENTORS

ROBERT C. MIERENDORF

ARMAND G. MUELLER

BY

Harold J. Rathbun

United States Patent Office 3,258,661
Patented June 28, 1966

3,258,661

SEALED SEMICONDUCTOR DEVICE

Robert C. Mierendorf and Armand G. Mueller, Wauwatosa, Wis., assignors to Square D Company, Park Ridge, Ill., a corporation of Michigan Filed Dec. 17, 1962, Ser. No. 245,026
7 Claims. (Cl. 317—234)

This invention relates to an enclosure and terminal or lead arrangement for semiconductor devices and more particularly to an enclosure and lead arrangement for transistors or silicon controlled rectifiers which facilitates their use for industrial control purposes.

Semiconductor devices such as transistors and silicon controlled rectifiers, as usually manufactured, have terminals or leads extending away from opposite ends thereof in opposite directions. When such devices are used as components of controllers for industrial control systems, it is of advantage to mount them on panels together with other components of the controller. This is difficult to do unless all of the leads extend away from the semiconductor devices in the same direction so that all of the leads can extend outwardly in the same direction from the panel.

Because of the fragility of semiconductor devices, their susceptibility to damage by air-borne contaminants, and the delicateness of the connections made thereto by the leads, it is desirable to house the devices in individual rigid, hermetically-sealed enclosures. To facilitate the mounting of such an enclosed device on an industrial control panel, the leads should extend outwardly from one end of the enclosure and the opposite end of the enclosure should be arranged for mounting on the panel.

Semiconductor devices produce heat when in use, and it is therefore essential, when they are mounted on a panel of an industrial controller, that provision be made for efficient transfer of heat therefrom. Preferably, any enclosure and lead arrangement designed to adopt the devices for industrial control use should increase rather than decrease the efficiency of heat dissipation.

It is an object of this invention to provide an improved mounting arrangement for semiconductor devices which overcomes the foregoing problems.

Another object is to provide an improved terminal or lead arrangement for semiconductor devices.

Another object is to provide an improved enclosure for a semiconductor device that facilitates the making of electrical connections thereto and protects the device from damage.

A still further object is to provide an improved means for mounting semiconductor devices within an enclosure that facilitates the transfer of heat from the device.

Figure 1:
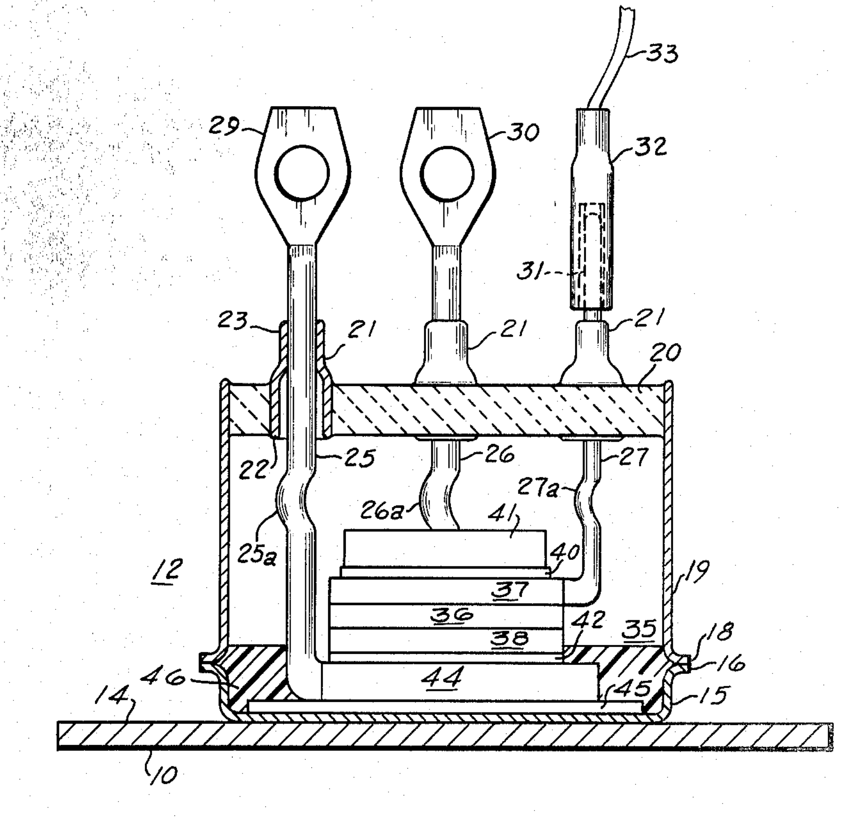
Figure 2:
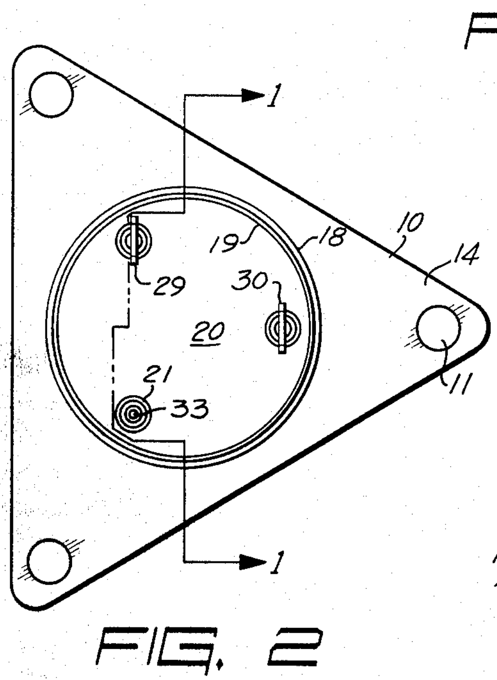

Other objects and advantages will become apparent from the following description wherein reference is made to the drawings, in which FIGURE 1 is an enlarged sectional view of a preferred embodiment of the invention taken generally along the line 1—1 of FIGURE 2;

FIGURE 2 is a top-plan view of the embodiment of FIGURE 1.

Referring to the drawings, there is provided a generally triangular base plate 10 having mounting holes 11 at the respective apices thereof and formed of copper or other metal having good heat-conducting properties. An enclosure 12 brazed or soldered to an upper surface 14 of the base plate 10 comprises a relatively shallow, dish-shaped lower portion 15 having an outwardly directed annular flange 16 at its upper rim which is brazed, soldered, or cold-welded to a similar annular flange 18 formed at the lower rim of a cylindrical upper portion 19. The enclosure portions 18 and 19 are preferably also made from copper or other metal having high thermal conductivity. The joint between the flanges 16 and 18 is air-tight, and the upper open end of the metal enclosure portion 19 is closed by a disc 20 of glass or other suitable insulating material having its outer peripheral edge hermetically sealed to the inner peripheral wall of the portion 19 in any suitable and well-known manner.

Three circular openings in the disc 20 are disposed in triangular spaced arrangement and each receives a bushing 21, preferably made of copper. Each of the bushings 21 has a lower cylindrical portion 22 hermetically sealed to the peripheral side wall of its associated opening and an upper cylindrical portion 23 of reduced diameter extending upwardly from the disc 20.

An anode lead 25, a cathode lead 26, and a gate or control lead 27 pass through the bushings 21, respectively. Preferably, the leads 25, 26, and 27 are provided with respective bent portions 25*a*, 26*a*, and 27*a* to absorb thermal and other stresses and the respective outer end portions of the leads 25 and 26 are flattened as at 29 and 30 and the flattened portions have central openings to facilitate the connection of electrical conductors thereto. An outer end portion 31 of the gate or control lead may be arranged to receive a suitable push-on connector 32 electrically connected to a conductor 33. Although not illustrated, the leads 25, 26, and 27 may be insulated except where a seal, to be described, is made with the bushings 21.

The invention is shown in connection with a silicon controlled rectifier 35 comprising a layer of N-conductive silicon 36 interposed between layers of P-conductive silicon 37 and 38. A layer 40 of N-conductive gold-antimony alloy is interposed between the upper silicon layer 37 and a contact plate 41 of molybdenum to which the cathode lead 26 is electrically connected, and a layer 42 of aluminum is interposed between the lower silicon layer 38 and a contact plate 44 of molybdenum to which the anode lead 25 is electrically connected. The gate lead 27 is electrically connected to the silicon layer 37.

The rectifier 35 rests on a wafer 45 of a suitable ceramic material of high thermal conductivity disposed on the inner surface of the lower portion 15 of the enclosure 12. Preferably, the ceramic material is beryllia (BeO), although alumina ($Al_2O_3$) or mixtures of beryllia and alumina can be used if desired, it being understood that the usual fillers might be added. The ceramic wafer 45 electrically insulates the contact plate 44 from the enclosure 12, but because of its high coefficient of thermal conductivity, facilitates transfer of heat from the rectifier 35 to the enclosure portion 15 from which it is rapidly transferred to the plate 10 which functions as a heat sink.

The ceramic wafer 45 and the rectifier 35 may be held in position within the enclosure 15 in any suitable manner as by thin layers of adhesive. As shown, the wafer 45 and rectifier 35 are secured by a solidified mass of an epoxy resin compound 46 poured while in the liquid state into the enclosure 12 and subsequently hardened by a suitable catalyst. The epoxy compound 46 preferably has good heat-conducting properties to enhance further the heat exchange, and, as an example, may comprise bisphenol A and an epichlorohydrin-type epoxy filled to about 150% by weight with alumina with biglycidal ether used as a thinner. A polyamide-amine hardener or catalyst can be used. The epoxy resin compound 36 not only serves as an adhesive potting material to hold the rectifier 35 and ceramic wafer 45 in place, but also completely covers the ceramic wafer 45. The covering can become important, if beryllia is used in the wafer 45, because of the toxic nature of beryllia.

During manufacture, the leads 25, 26, and 27 are loosely received in the respective bushings 21 and the container 12 is preferably purged of air and moisture and then filled with an inert gas such as nitrogen. After this has been done, the bushings 21 are sealed by crimping them against the respective leads 25, 26, and 27.

The base plate 10 may be mounted on a horizontal or vertical panel or on the walls of an enclosure by a suitable adhesive or by screws received in the respective mounting holes. It also may be mounted in a similar manner on a device controlled by the rectifier 35 such as an ignitron (not shown).

Having thus described our invention, we claim:

1. A sealed semiconductor device comprising an enclosure of heat conducting material closed at one end by an electrically insulating wall, a wafer of electrical insulating material having good heat-conducting properties having a surface in intimate contact with a surface at another end of the enclosure opposite the insulating wall, a semiconductor element positioned between the wafer and the insulating wall in good heat-conducting engagement with the wafer and having leads connected thereto extending to the outside of the enclosure through sealed openings in the insulating wall, a solidified epoxy resin compound of good heat conducting properties covering the wafer and engaging at least portions of the semiconductor element and the surface of the enclosure for adhesively securing the wafer and the semiconductor element to the surface of the enclosure and providing a good heat conducting path between the semiconductor element and the enclosure, and a heat-conducting and mounting portion extending outwardly from an external wall portion of the enclosure providing a means for dissipating heat conducted by the epoxy compound and wafer to the enclosure from the semiconductor element.

2. A sealed semiconductor device in accordance with claim 1 wherein the mounting portion is a flat plate of triangular configuration having openings at each corner for mounting the device on a support.

3. A sealed semiconductor device in accordance with claim 1 wherein the wafer is at least partly formed of beryllia and the epoxy resin has a filler of alumina.

4. A sealed semiconductor device in accordance with claim 1 wherein the wafer is at least partly formed of a mixture of beryllia and alumina and portions of the leads extending external to the enclosure are provided with terminals which are maintained in spaced relation from each other by the conducting material.

5. A sealed semiconductor device in accordance with claim 4 wherein the mounting portion for the device and the terminals are at opposite ends of the enclosure.

6. A sealed semiconductor device in accordance with claim 1 wherein the semiconductor element is a silicon controlled rectifier.

7. A sealed semiconductor device in accordance with claim 2 characterized in that the mounting portion is of substantial mass relative to the mass of the enclosure thereby to serve as an efficient heat sink for the device.

References Cited by the Examiner

UNITED STATES PATENTS

| | | | |
|---|---|---|---|
| 2,853,661 | 9/1958 | Houle et al. | 317—234 |
| 2,929,972 | 3/1960 | Roka et al. | 317—235 |
| 2,930,904 | 3/1960 | Fritts | 317—234 |
| 2,981,876 | 4/1961 | Willemse | 317—235 |
| 3,004,196 | 10/1961 | Drexel | 317—234 |
| 3,018,425 | 1/1962 | Wagner | 317—234 |
| 3,020,454 | 2/1962 | Dixon | 317—235 |
| 3,025,437 | 3/1962 | Namen et al. | 317—235 |
| 3,031,738 | 5/1962 | Paulovitz | 317—234 |
| 3,041,510 | 6/1962 | Hower et al. | 317—235 |
| 3,054,032 | 9/1962 | Sabins | 317—234 |
| 3,061,766 | 10/1962 | Kelley | 317—234 |

JOHN W. HUCKERT, *Primary Examiner.*

JAMES D. KALLAM, *Examiner.*

L. ZALMAN, C. E. PUGH, *Assistant Examiners.*